United States Patent [19]

Burgin, Jr. et al.

[11] Patent Number: 4,762,578

[45] Date of Patent: Aug. 9, 1988

[54] NON-CONTACT SENSING AND CONTROLLING OF SPACING BETWEEN A DEPOSITING TIP AND EACH SELECTED DEPOSITING LOCATION ON A SUBSTRATE

[75] Inventors: John I. Burgin, Jr., Binghamton; Michael J. Kane, Castle Creek; Michael M. Levie, Binghamton, all of N.Y.

[73] Assignee: Universal Instruments Corporation, Binghamton, N.Y.

[21] Appl. No.: 43,623

[22] Filed: Apr. 28, 1987

[51] Int. Cl.$^4$ ............................................. G01B 15/00
[52] U.S. Cl. ........................................ 156/64; 29/740; 118/712; 156/350; 156/356; 356/4; 356/375
[58] Field of Search .................. 156/350–351, 156/356–357, 578; 118/712, 680; 228/9–10; 250/234, 224; 222/52; 356/4, 375, 376; 29/740, 741

[56] References Cited

U.S. PATENT DOCUMENTS

| | | | |
|---|---|---|---|
| 3,143,041 | 8/1964 | Namenyi-Katz | 409/218 |
| 3,809,308 | 5/1974 | Roeder et al. | 228/9 |
| 4,485,387 | 11/1984 | Drumheller | 346/140 R |
| 4,661,368 | 4/1987 | Rohde et al. | 427/8 |

Primary Examiner—David Simmons
Attorney, Agent, or Firm—Franklin D. Wolffe; Morris Fidelman

[57] ABSTRACT

The invention involves non-contact sensing of a selected location on a substrate at which material is to be deposited, and positioning of a material depositing tip a preferred distance from this location on the substrate according to such sensing and in preparation for the depositing. Preferably, the tip is advanced to a preferred spacing between it and the substrate, without overshooting the spacing and without contacting the substrate, in preparation for depositing.

29 Claims, 2 Drawing Sheets

NON-CONTACT SENSING AND CONTROLLING OF SPACING BETWEEN A DEPOSITING TIP AND EACH SELECTED DEPOSITING LOCATION ON A SUBSTRATE

BACKGROUND OF THE INVENTION

The invention relates to depositing dots of adhesive at selected locations on the surface of a printed circuit board by sensing a reference spacing, between an adhesive dispensing nozzle tip advancing toward the substrate and each selected location on the substrate, and halting advance of the tip at a preferred distance from each selected location. The invention also may relate to spacing of the tip of a vacuum spindle of a pick and place machine for handling surface mountable device (SMD) components.

Prior art devices generally include those which touch the depositing tip to the selected location on the substrate surface at which material is to be deposited and retract the tip away from the surface by a specific amount in order to attain a preferred spacing therebetween. With devices which sense contact with the surface by a reactive force such as disclosed in U.S. Pat. No. 4,661,368, calibration difficulties are encountered when used with flexible substrates, since contact with the substrate can cause it to flex before a required amount of reactive force is sensed via the tip. Thus, subsequent retraction of the tip, based on the sensed position of the surface, can result in insufficient spacing therebetween. Additionally, touching the board with the tip can cause jarring or movement of components and nicking of the fragile surfaces of some substrates.

Other prior art surface locating devices utilize so called "outriggers" in sensing the appropriate spacing between a tip and a substrate by engaging and locating the substrate at a location other than the exact place at which deposition is to take place. Thus, a much larger "footprint" on the circuit board, involving the depositing tip and the sensing outrigger, is required. Additionally, this prior art does not compensate for circuit board warpage or surface waviness at the specific location at which depositing is to take place, since it senses a location on the substrate which is spaced from the specific location at which deposition is to occur.

Thus, it is an objective of the invention to avoid contact with the board by the sensor while providing exact spacing between a dispensing tip or the like and each selected location on the board at which material is to be deposited.

Further, it is an objective of the invention to avoid contact of the board by the dispensing tip and thus reduce the time necessary in retracting the tip from the substrate prior to depositing.

Additionally, it is an objective of the invention to avoid damaging the surface of the substrate and jarring or moving other components already mounted on the substrate.

Also, it is an objective of the invention to sense the spacing between the substrate and depositing tip at the exact selected location for each deposited dose or component so as to minimize the footprint on the substrate.

Still further, it is an objective of the invention to avoid the calibration difficulties inherent with "contact" type sensors when used with flexible substrates.

Additionally, it is an objective of the invention to avoid spacing inaccuracies caused by board warpage or waviness inherent in use of devices which sense locations on the substrate other than the exact location where depositing is to take place.

BRIEF SUMMARY OF THE INVENTION

In a preferred embodiment of the invention, the tip of an adhesive dispensing nozzle is advanced toward a printed circuit board surface and the point on the circuit board at which a dot of adhesive is to be deposited is sensed when the tip is at a reference or trigger distance from the circuit board. At this time, the sensor signals a controller by a hardware interrupt so that the controller begins reading the output of an encoder. Thus, the controller monitors the amount of travel of the tip past the reference distance and instructs the drive motor to halt advance of the tip a particular distance past the reference distance. The resulting preferred spacing or distance of the tip from the specific location on the circuit board or substrate at which depositing is to take place equals the "reference distance" minus the "particular distance." The distance of advance of the tip past the reference distance is a selectable program variable of the controller.

The novel features which are considered as characteristic for the invention are set forth in particular in the appended claims. The invention itself, however, in construction and method of operation, together with additional objectives and advantages thereof, will be best understood from the following detailed disclosure when read in connection with the accompanying drawings.

BRIEF DESCRIPTION OF THE DRAWINGS

Throughout the drawings, like numerals have been utilized where applicable.

DETAILED DESCRIPTION OF THE INVENTION

Figure 1:
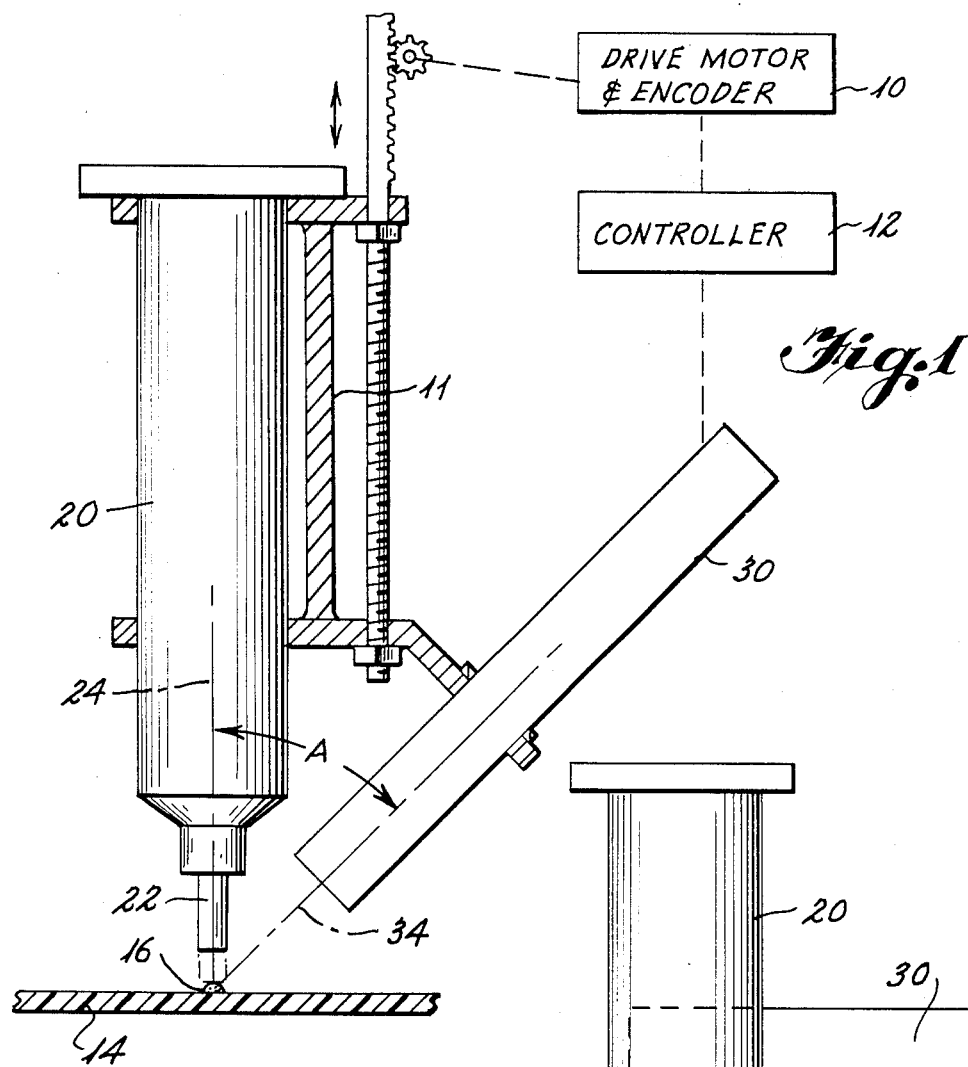
FIG. 1 is a front elevation, paritally in schematic form, of an apparatus utilized in effecting the invention.
Figure 2:
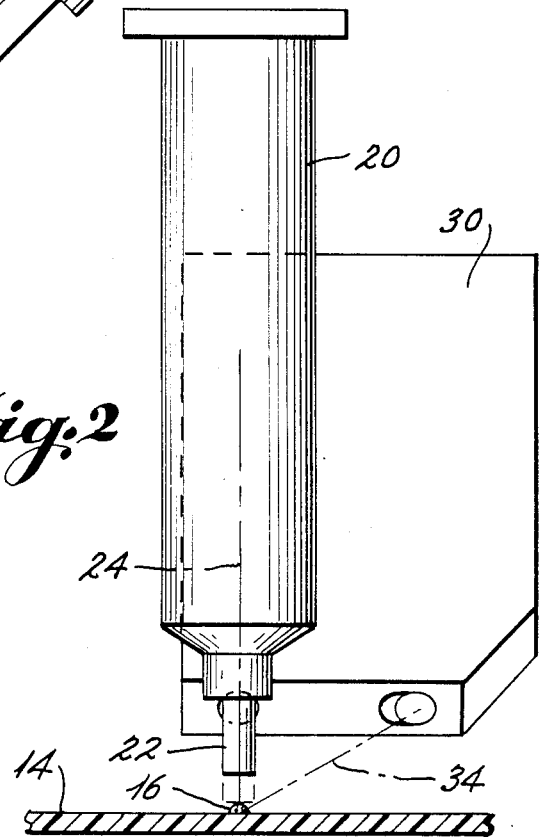
FIG. 2 is a right side elevation, with parts removed, of the device of FIG. 1.

Referring to FIGS. 1 and 2, a dot of glue 16 has been applied to printed circuit board 14 via nozzle tip 22. As seen in FIG. 1, bracket 11 holds adhesive dispenser 20 and sensor 30 for simultaneous vertical reciprocation, with the displacement being provided and monitored by a drive motor and encoder 10 according to a controller 12.

Figure 4:
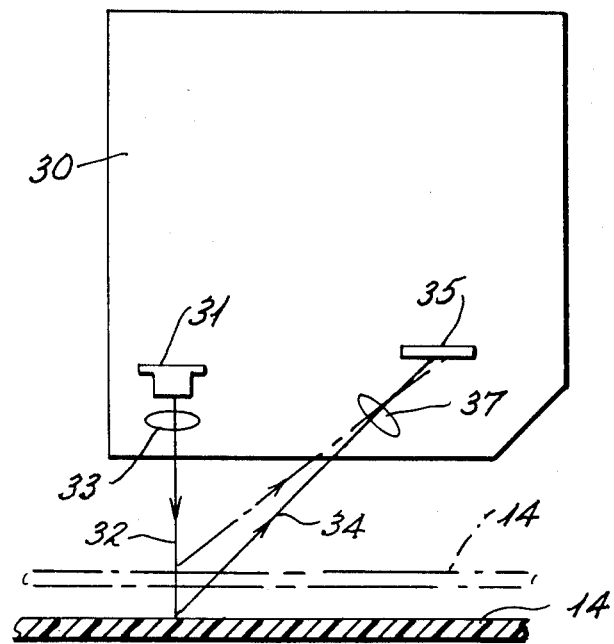
FIG. 4 is a schematic representation of the sensor and how it operates.

The reader's attention is directed to FIG. 4 for a description of the operation of optical sensor 30 which includes a laser diode light transmitter 31, solid state reflected light receiving detector 35, and their corresponding lenses 33 and 37. A typical sensor of this sort is manufactured by CyberOptics Corporation of Minneapolis, Mn. as model LT-100.

As seen in FIG. 4, a transmitted beam of light 32 is focused as a small point of light (easily visible to an operator) onto the surface of the circuit board 14, and the reflected light beam 34 is focused onto a solid state detector 35. As the distance between sensor 30 and circuit board 14 lessens, the reflected image moves along the length of the detector 35, as indicated in phantom lines in FIG. 4, with the position of the image on the detector being indicative of the spacing between the sensor 30 and the top surface of circuit board 14. Thus, the sensor is able to measure by the position of the image on the detector and supply a trigger output signal at a preset distance from the reflecting surface.

As illustrated in FIGS. 1 and 2, of particular advantage to the instant invention is the fact that the plane defined by both the transmitted and reflected beams 32 and 34 may be at an angle of up to 45 degrees from a normal to the surface location being detected. Thus, such sensing and distance measuring is particularly applicable for points on the surface underneath a reciprocating dispensing or depositing nozzle or the like. The transmitted beam 32 is hidden by the reflected beam 34 in FIG. 1 and by tip 22 in FIG. 2.

In operation, the longitudinal axis 24 of adhesive dispenser 20 is positioned generally normal to the selected location on circuit board 14 at which an adhesive dot 16 is to be deposited. Positioning of the dispenser at the various selected locations on the circuit board is accomplished by moving the circuit board in directions parallel to the plane of the circuit board or, alternatively, by similarly moving the adhesive dispenser 20 to various locations of the circuit board.

Having positioned dispenser 20 at a selected location above the circuit board, the drive motor 10 is actuated to advance the dispenser 20 and sensor 30 toward the board along longitudinal axis 24. During such advancing toward the board, the tip of nozzle 22 will pass a reference location which is a selectable distance above the surface of the circuit board so that a trigger location on detector 35 will receive the reflected image of the laser dot. At that time, the controller 12 is signaled to monitor the encoder and thus the distance that the tip of nozzle 22 travels past the reference location. With such an arrangement, the distance by which the tip of nozzle 22 travels past the reference location is programmable, and advancing of the tip may be halted a set distance past the reference location and thus at a set distance from the surface of the circuit board 14.

In practice, the dispensing tip was spaced 0.008 inches from the board surface and glue was dispensed so as to bridge the gap between the board and the dispensing tip. Having forced the desired dosage of glue through the nozzle, the tip was retracted away from the surface of circuit board 14 and a dot of glue remained adhered to the board and separated from the tip resulting in a glue dot having a height of approximately 0.015 inches.

Figure 3:
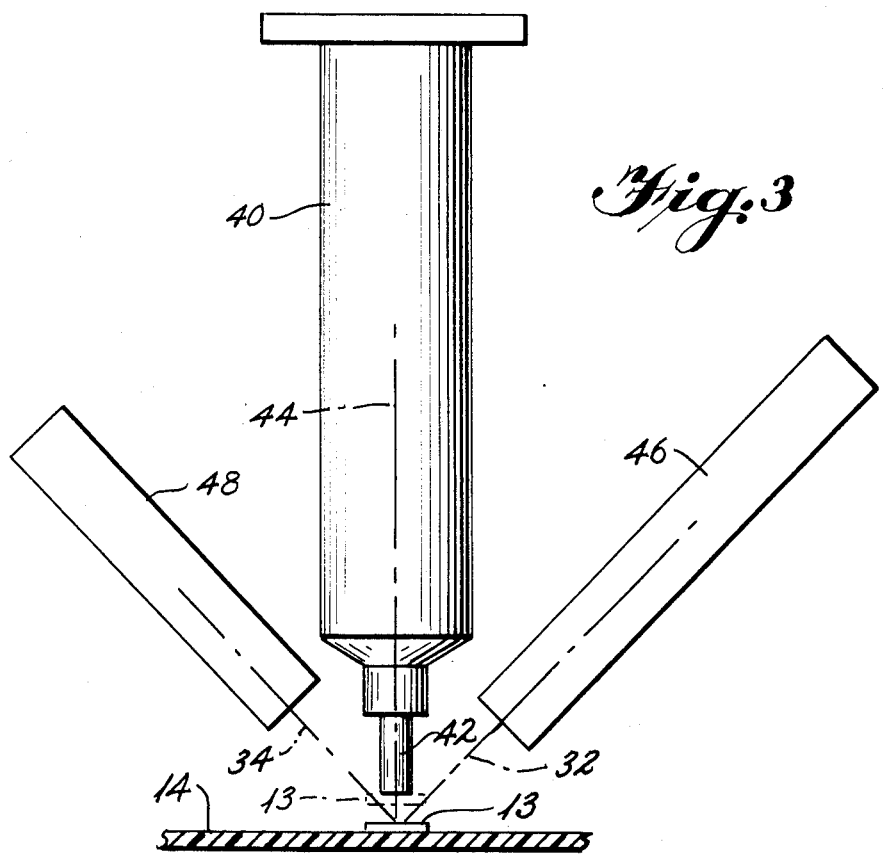
FIG. 3 is a front elevation, similar to that of FIG. 1, illustrating another embodiment of the invention.

As illustrated in FIG. 3, this concept of sensing and providing a specific spacing of a tip from a surface of a circuit board may be utilized in retrieving components from a surface and/or placing components on a surface by means of a pick and place and head 40 which is reciprocatable along the longitudinal axis 44 and has a vacuum nozzle 42 for holding the components to the tip thereof. Thus, the particular spacing between the tip of nozzle 42 and the top surface of circuit board 14 may be selectable according to the thickness (or height as viewed in FIG. 3) of the component 18 so as to avoid damage or unnecessary jarring or movement to the component or substrate during such picking or placing of the component.

As also seen in FIG. 3, the optical sensor may be divided separately into a transmitter housing 46 and a receiver housing 48. This is particularly advantageous when the surface being sensed, i.e., the top surface of the component being picked up or the surface at the location where a component is to be placed, is particularly reflective or shiny and thus limits the angle at which an individual sensor housing 30 can be tilted away from the longitudinal axis of the dispenser or pick and place head with which it is utilized. A matte finish is generally preferred for accuracy when tilting the sensor as illustrated in FIGS. 1 and 2, with lesser angles of tilt being required for those surfaces which are less dull or more shiny and reflective. Of course, with the arrangement of FIG. 3, the reflective properties of the sensed surface do not present this problem and, yet, the device is still able to sense a point on the longitudinal axis of the pick and place head or depositing head.

Having described the invention, it will be seen that the objectives set forth above, among those made apparent from the preceding description, are effeciently obtained and, since certain changes may be made in carrying out the above method and in the construction set forth without departing from the scope of the invention, it is intended that all matter contained in the above description or shown in the accompanying drawings shall be interpreted as illustrative and not in a limiting sense.

For instance, it is considered within the context of the invention that the sensor 30, or at least the lens system thereof may be tiltable in concert with movement of the tip along the longitudinal axis of the head being used, thus obviating the need for the sensor to be attached for movement with the dispensing or pick and place head back and forth along a longitudinal axis. It is also contemplated that sources of light other than the laser can be utilized within the context of the invention. However, the laser projects a footprint onto the surface being sensed of only 0.001 inch, while providing greater accuracy and being less susceptible to color variations of the sensed surface than most other types of light. It is also contemplated, although not preferred, that the particular sensor could be used to sense a location on the surface other than one which is in line with the longitudinal axis of the head, so as to act, in effect, as a non-contact "outrigger".

A suitable controller for use in implementing the disclosed invention is the 8223B Satellite Controller manufactured by Universal Instruments Corporation, Binghamton, NY.

The following claims are intended to cover all of the generic and specific features of the invention herein described, and all statements of the scope of the invention which, as a matter of language, might be said to fall therebetween.

We claim:

1. In a method of spacing a tool tip a preferred distance from a surface without touching said tip to said surface, the improvement comprising the steps of:
   advancing said tip toward said surface;
   detecting, electrically separate from said surface and during said advancing, a reference spacing between said tip and a location on said surface in line with an axis of said advancing; and
   halting advancing of said tip at a specified distance past said reference spacing, with said tip spaced said preferred distance from said surface location.

2. The improvement as in claim 1, and further comprising the step of:
   monitoring the advancing of said tip past said reference spacing.

3. The improvement as in claim 1, and further comprising the step of:

preselecting said reference spacing and specified and preferred distances.

4. The improvement as in claim 1, and further comprising the step of:
   providing an optic system and reflecting light of said system from said surface location in order to detect said reference spacing.

5. In a method of spacing a tip of an adhesive dispensing nozzle a preferred distance from a selected location on a substrate surface so as to deposit a dose of said adhesive at said selected location, the improvement comprising the steps of:
   detecting a reference spacing between said tip and selected location, during relative advancing of said tip toward said location, without touching said surface with a means for detecting said spacing;
   monitoring and controlling said advancing past said reference spacing; and
   halting said advancing at a specified distance past said reference spacing such that said tip is positioned at said preferred distance from said location.

6. The improvement as in claim 5, and further comprising the step of:
   optically detecting said reference spacing.

7. The improvement as in claim 6, and further comprising the step of:
   moving said detecting means in concert with advancing of said tip in order to detect said reference spacing.

8. In a method of operating a pick and place head for picking components from and placing components at selected surface locations, the improvement comprising, for each said selected location, the steps of:
   advancing a component holding portion of said head toward said location and detecting a reference spacing between a reference surface on said advancing portion and said selected location during said advancing;
   monitoring and controlling said advancing past said reference spacing; and
   halting said reference surface a preferred distance from said location sufficient for said picking and placing.

9. The improvement as in claim 8, and further comprising the steps of:
   reflecting light from a surface of a component to be picked up in order to effect said detecting in preparation for picking up said component, said selected location being on said component surface; and
   picking up said component.

10. The improvement as in claim 8, and further comprising the steps of:
    reflecting light from a surface of a circuit board at said selected location in order to effect said detecting in preparation for placing said component, wherein said preferred distance substantially equals a height of said component; and
    placing said component at said location.

11. In an apparatus for spacing a tool tip a preferred distance from a surface without touching said tip to said surface, the improvement comprising:
    means for advancing said tip toward said surface;
    means for detecting, during said advancing, a reference spacing between said tip and a location on said surface in line with an axis of said advancing said detecting means being electrically separate from said surface at said location; and
    means for halting advancing of said tip at a specified distance past said reference spacing, with said tip spaced said preferred distance form said surface location.

12. The improvement as in claim 11, and further comprising:
    means for monitoring the advancing of said tip past said reference spacing.

13. The improvement as in claim 11, and further comprising:
    means for preselecting said reference spacing, and specified and preferred distances.

14. The improvement as in claim 11, and further comprising:
    an optic system and means for reflecting light of said system from said surface location in order to detect said reference spacing.

15. In an apparatus for spacing a tip of an adhesive dispensing nozzle a preferred distance from a selected location on a substrate surface for depositing a dose of said adhesive at said selected location, the improvement comprising:
    means for detecting a reference spacing between said tip and selected location, during relative advancing of said tip toward said location, without touching said surface with a means for detecting said spacing;
    means for monitoring and controlling said advancing past said reference spacing; and
    means for halting said advancing at a specified distance past said reference spacing such that said tip is positioned at said preferred distance from said location.

16. The improvement as in claim 15, and further comprising:
    means for optically detecting said reference spacing.

17. The improvement as in claim 16, and further comprising:
    means for moving said detecting means in concert with advancing of said tip in order to detect said reference spacing.

18. In an apparatus having a pick and place head for picking components from and placing components at selected surface locations, the improvement comprising, for each said selected location:
    means for advancing a component holding portion of said head toward said location and detecting a reference spacing between a reference surface on said advancing portion and said selected location during said advancing;
    means for monitoring and controlling said advancing past said reference spacing; and
    means for halting said reference surface a preferred distance from said location sufficient for said picking and placing.

19. The improvement as in claim 18, and further comprising:
    means for reflecting light from a surface of a component to be picked up in order to effect said detecting in preparation for picking up said component, said selected location being on said component surface.

20. The improvement as in claim 18, and further comprising:
    means for reflecting light from a surface of a circuit board at said selected location in order to effect said detecting in preparation for placing said component, wherein said preferred distance substantially equals a height of said component.

21. The improvement as in claim 19, and further comprising:
a laser diode generative of said light; and
a solid state detector receiving said reflected light.

22. In a method of spacing a tool tip a preferred distance from a surface without touching said tip to said surface, the improvement comprising the steps of:
advancing said tip toward said surface;
detecting, during said advancing, a reference spacing between said tip and a location on said surface in line with an axis of said advancing;
monitoring the advancing of said tip past said reference spacing; and
halting advancing of said tip at a specified distance past said reference spacing, with said tip spaced said preferred distance from said surface location.

23. In a method of spacing a tool tip a preferred distance from a surface without touching said tip to said surface, the improvement comprising the steps of:
advancing said tip toward said surface;
detecting, during said advancing, a reference spacing between said tip and a location on said surface in line with an axis of said advancing;
halting advancing of said tip at a specified distance past said reference spacing, with said tip spaced said preferred distance from said surface location; and
preselecting said reference spacing and specified and preferred distances.

24. In a method of spacing a tool tip a preferred distance from a surface without touching said tip to said surface, the improvement comprising the steps of:
providing an optic system;
advancing said tip toward said surface;
detecting, during said advancing, a reference spacing between said tip and a location on said surface in line with an axis of said advancing by reflecting light of said system from said surface location; and
halting advancing of said tip at a specified distance past said reference spacing, with said tip spaced said preferred distance from said surface location.

25. In an apparatus for spacing a tool tip a preferred distance from a surface without touching said tip to said surface, the improvement comprising:
means for advancing said tip toward said surface;
means for detecting, during said advancing, a reference spacing between said tip and a location on said surface in line with an axis of said advancing;
means for monitoring the advancing of said tip past said reference spacing; and
means for halting advancing of said tip at a specified distance past said reference spacing, with said tip spaced said preferred distance from said surface location.

26. In an apparatus for spacing a tool tip a preferred distance from a surface without touching said tip to said surface, the improvement comprising:
means for advancing said tip toward said surface;
means for detecting, during said advancing, a reference spacing between said tip and a location on said surface in line with an axis of said advancing;
means for halting advancing of said tip at a specified distance past said reference spacing, with said tip spaced said preferred distance from said surface location; and
means for preselecting said reference spacing, and specified and preferred distances.

27. In an apparatus for spacing a tool tip a preferred distance from a surface without touching said tip to said surface, the improvement comprising:
means for advancing said tip toward said surface;
means for detecting, during said advancing, a reference spacing between said tip and a location on said surface in line with an axis of said advancing, said detecting means comprising an optic system and means for reflecting light of said system from said surface location; and
means for halting advancing of said tip at a specified distance past said reference spacing, with said tip spaced said preferred distance from said surface location.

28. In a method of spacing a tool tip a preferred distance from a surface without touching said tip to said surface, the improvement comprising the steps of:
advancing said tip toward said surface;
detecting, during said advancing, a reference spacing between said tip and a point on said surface in line with an axis of said advancing; and
halting advancing of said tip at a specified distance past said reference spacing, with said tip spaced said preferred distance from said point.

29. In an apparatus for spacing a tool tip a preferred distance from a surface without touching said tip to said surface, the improvement comprising:
means for advancing said tip toward said surface;
means for detecting, during said advancing, a reference spacing between said tip and a point on said surface in line with an axis of said advancing; and
means for halting advancing of said tip at a specified distance past said reference spacing, with said tip spaced said preferred distance from said point.

* * * * *